(12) United States Patent
Caletka et al.

(10) Patent No.: US 6,333,551 B1
(45) Date of Patent: Dec. 25, 2001

(54) SURFACE PROFILING IN ELECTRONIC PACKAGES FOR REDUCING THERMALLY INDUCED INTERFACIAL STRESSES

(75) Inventors: David V. Caletka, Apalachin; Eric A. Johnson, Greene, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/656,941

(22) Filed: Sep. 7, 2000

(51) Int. Cl.$^7$ .............................. H01L 23/10; H01L 23/34
(52) U.S. Cl. ..................... 257/707; 257/706; 257/719; 257/796; 438/122
(58) Field of Search .................................. 257/706, 707, 257/712, 713, 714, 719, 722, 796; 438/122

(56) References Cited

U.S. PATENT DOCUMENTS

| | | | |
|---|---|---|---|
| 4,092,697 | * | 5/1978 | Spaight . |
| 4,825,284 | * | 4/1989 | Soga et al. . |
| 5,510,956 | * | 4/1996 | Suzuki . |
| 6,229,702 | * | 5/2001 | Tao et al. . |

FOREIGN PATENT DOCUMENTS

| | | |
|---|---|---|
| 58111354A2 | 7/1983 | (JP) . |
| 63300519A2 | 12/1988 | (JP) . |
| 6268120A2 | 9/1994 | (JP) . |
| 9115835 | 5/1997 | (JP) . |
| 11163231A2 | 6/1999 | (JP) . |

\* cited by examiner

*Primary Examiner*—Sheila V. Clark
(74) *Attorney, Agent, or Firm*—Schmeiser, Olsen & Watts; Lawrence R. Fraley (57) ABSTRACT

A method and structure for coupling a heat conductor (e.g., heat spreader, heat sink) to a semiconductor chip. In a first embodiment, a thermally conductive shape is formed on the heat conductor, a material in an uncured or partially cured state is dispensed on the chip and on peripheral portions of the chip, and the heat conductor is applied to the material to push the thermally conductive shape into the material such that the material is redistributed to contact both the thermally conductive shape and the chip. The material is then cured (e.g., by pressurization at elevated temperature). In a second embodiment, a thermally conductive shape is formed on the chip, a material (e.g., epoxy) in an uncured or partially cured state is dispensed on the thermally conductive shape and on peripheral portions of the chip, and the heat conductor is pushed into the material to make the material contact both the thermally conductive shape and the heat conductor. The material is then cured (e.g., by pressurization at elevated temperature). For both the first embodiment and the second embodiment, an average thickness of a peripheral portion of the cured material exceeds an average thickness of a central portion of the cured material.

32 Claims, 5 Drawing Sheets

FIG. 5

SURFACE PROFILING IN ELECTRONIC PACKAGES FOR REDUCING THERMALLY INDUCED INTERFACIAL STRESSES

BACKGROUND OF THE INVENTION

1. Technical Field

The present invention relates to a method and structure for coupling a heat sink or heat spreader to a semiconductor chip.

2. Related Art

Figure 1:
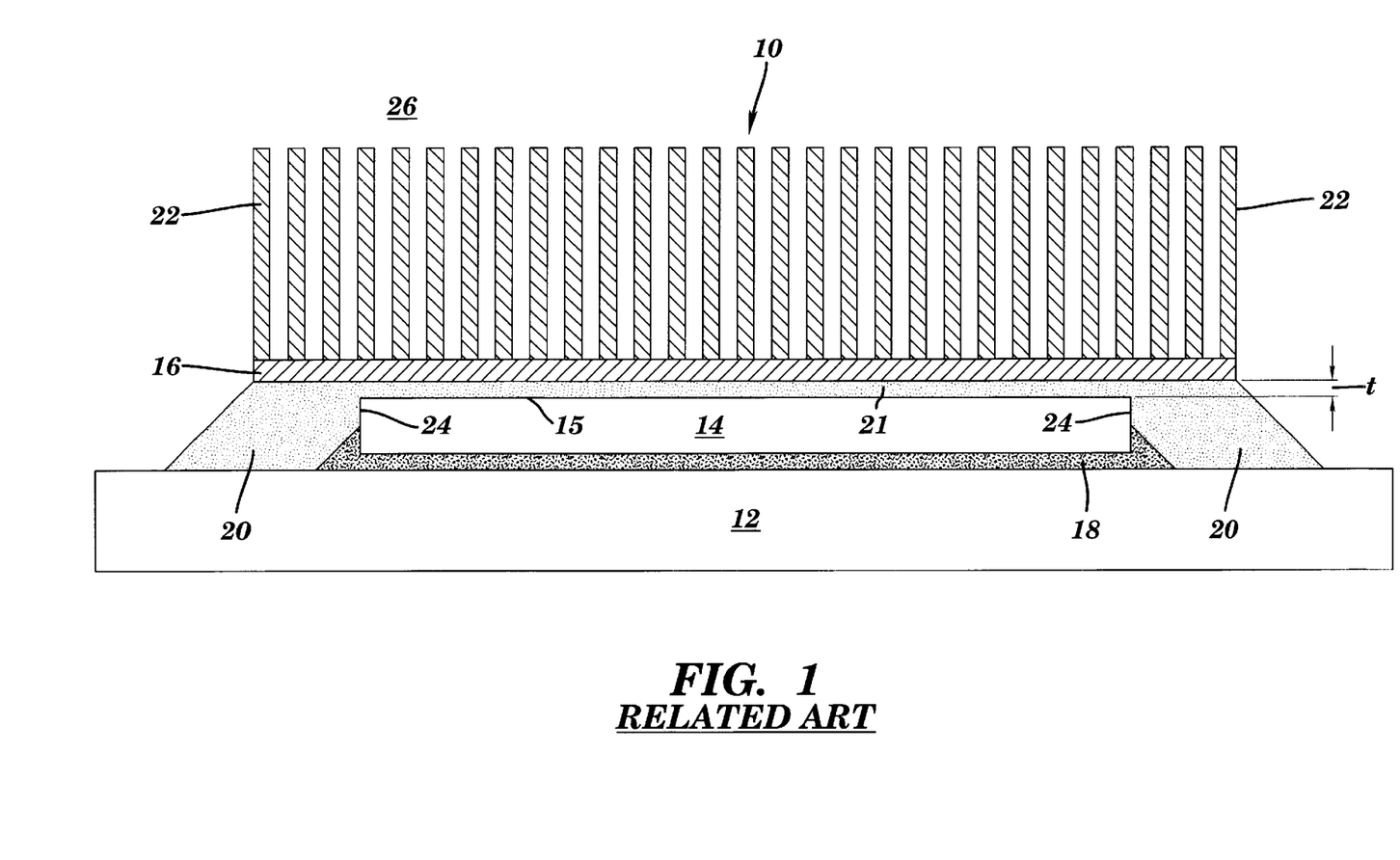
FIG. 1 depicts a front cross-sectional view of an electronic package, in accordance with the related art.

FIG. 1 illustrates an electronic package 10 with a semiconductor chip 14 coupled to a chip carrier 12. A heat spreader 16 is coupled to the chip 14 with an interfacing encapsulant 20 between the heat spreader 16 and the chip 14. If conductive fins 22 are present, then a heat sink comprises a composite of the heat spreader 16 and the conductive fins 22. Although the discussion infra in this Related Art section discusses only the heat spreader 16, it should be understood that the heat sink may be present and is analogous to the heat spreader 16. The encapsulant 20 serves to couple the heat spreader 16 to both the chip 14 and the chip carrier 12. A layer 21 of the encapsulant 20 between the chip 14 and the heat spreader 16 has a constant thickness (t), wherein t is in a direction that is normal to a surface 15 of the chip 14. An underfill 18 relieves thermally induced stresses, as well as consequent premature fatigue failure, that might otherwise be imposed on solder connections between the chip 14 and the chip carrier 12 due to differential thermal expansion between the chip 14 and the chip carrier 12. The differential thermal expansion is a consequence of a coefficient of thermal expansion (CTE) differences between the chip 14 (e.g., 3 to 6 ppm/° C.) and the chip carrier 12 (e.g., 10 to 24 ppm/° C. for an organic chip carrier; 6 to 10 ppm/° C. for a ceramic chip carrier).

The encapsulant 20 typically has a much higher CTE (e.g., 17 to 70 ppm/° C.) than a CTE of the chip 14 (e.g., 3 to 6 ppm/° C.) which causes the encapsulant 20 to swell or contract more 5 than the chip 14 when the electronic structure 10 is heated or cooled, respectively. As the encapsulant 20 swells, the encapsulant 20 expands away from the chip 14 and lifts the heat spreader 16 away from the chip 14, which causes high thermally induced stresses at the interfaces with both the chip 14 and the heat spreader 16. Because of the aforementioned thermally induced stresses, the chip 14 or the heat spreader 16 may delaminate from the encapsulant 20, or a crack in the encapsulant 20 may form and propagate, with an accompanying loss of structural integrity and/or degradation of heat transfer capability. The thermally induced stresses at the interfaces of the chip 14 and the heat spreader 16 to the encapsulant 20 are highest near peripheral edges 24 of the chip 14.

A method that reduces interfacial thermally induced stresses and does not materially increase thermal resistance is needed for coupling a heat spreader or a heat sink to a chip.

SUMMARY OF THE INVENTION

The present invention provides an electronic package, comprising:

a first structure selected from the group consisting of a semiconductor device and a thermally conductive member;

a second structure, wherein the second structure includes the thermally conductive member if the first structure includes the semiconductor device, and wherein the second structure includes the semiconductor device if the first structure includes the thermally conductive member;

a thermally conductive shape in contact with the first structure; and a thermally conductive material in contact with the second structure and with the thermally conductive shape, wherein an average thickness of a peripheral portion of the thermally conductive material exceeds an average thickness of a central portion of the thermally conductive material.

The present invention provides a method of forming an electronic package, comprising:

forming a thermally conductive shape on a first structure, wherein the first structure is selected from the group consisting of a semiconductor device and a thermally conductive member;

interfacing a material in an uncured or partially cured state between a second structure and the thermally conductive shape, wherein the material is thermally conductive, wherein the second structure includes the thermally conductive member if the first structure includes the semiconductor device, and wherein the second structure includes the semiconductor device if the first structure includes the thermally conductive member; and curing the material, wherein an average thickness of a peripheral portion of the cured material exceeds an average thickness of a central portion of the cured material.

The present invention reduces interfacial thermally induced stresses and does not materially increase thermal resistance between the semiconductor device and the thermally conductive member.

DETAILED DESCRIPTION OF THE INVENTION

Figure 2:
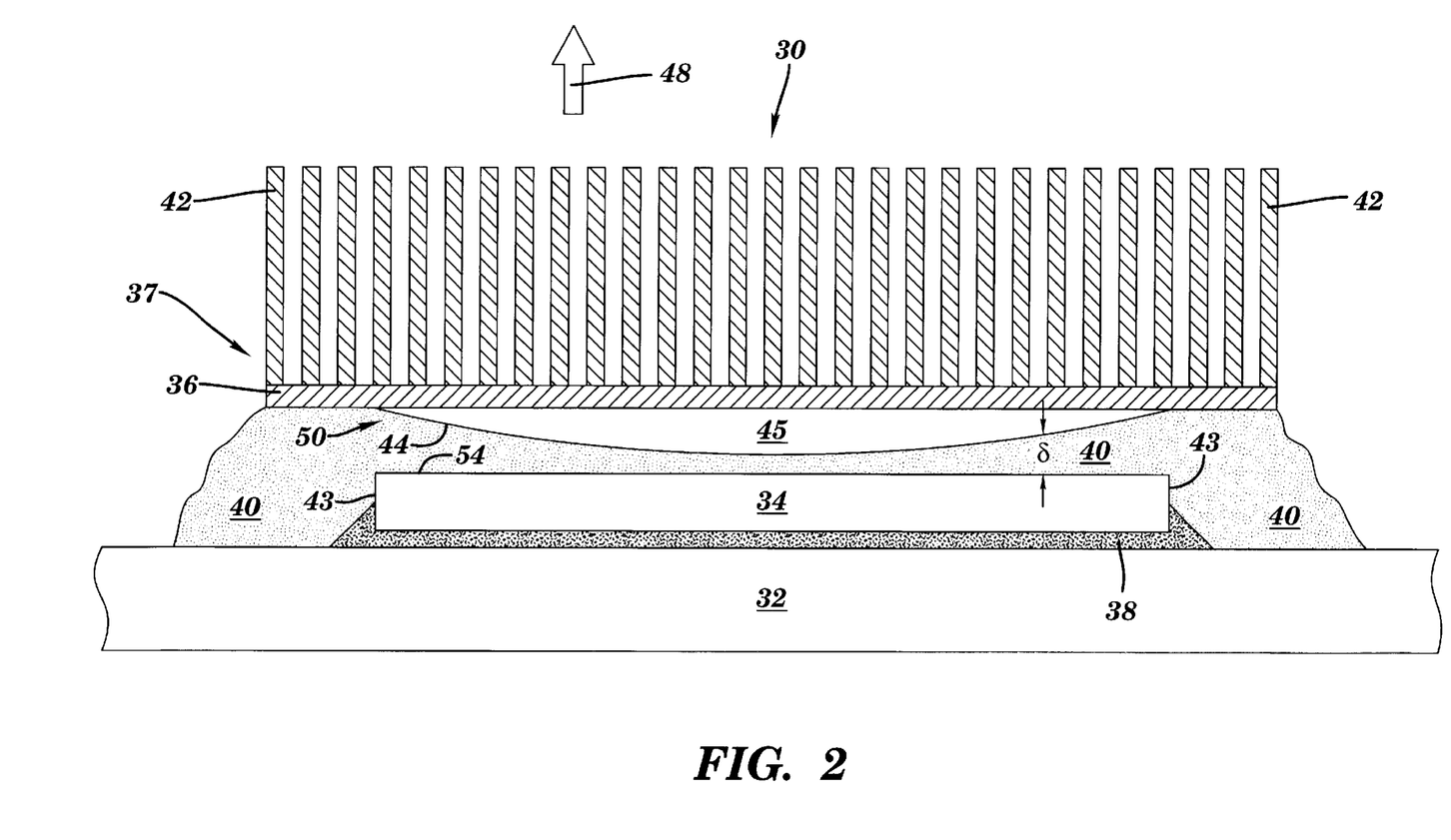
FIG. 2 depicts a front cross-sectional view of an electronic package having a thermally conductive shape, in accordance with first embodiments of the present invention.

FIG. 2 illustrates a front cross-sectional view of an electronic package 30, in accordance with first embodiments of the present invention. The electronic package 30 is fabricated as follows. A semiconductor device 34 is coupled to an electronic carrier 32 by any method known to one of ordinary skill in the art. The semiconductor device 34, may include, inter alia, a semiconductor chip. The electronic carrier 32 may include, inter alia, a chip carrier or a circuit card. An example of coupling the semiconductor device 34 to the electronic carrier 32, wherein the semiconductor device 34 includes a semiconductor chip and the electronic carrier 32 includes a chip carrier, is by a controlled collapse chip connection (C4) process using C4 solder balls (not shown). An underfill 38 may be inserted between the semiconductor device 34 and the electronic carrier 32 to mitigate thermally induced stresses resulting from a coefficient of thermal expansion (CTE) mismatch between the semiconductor device 34 and the electronic carrier 32.

Figure 3:
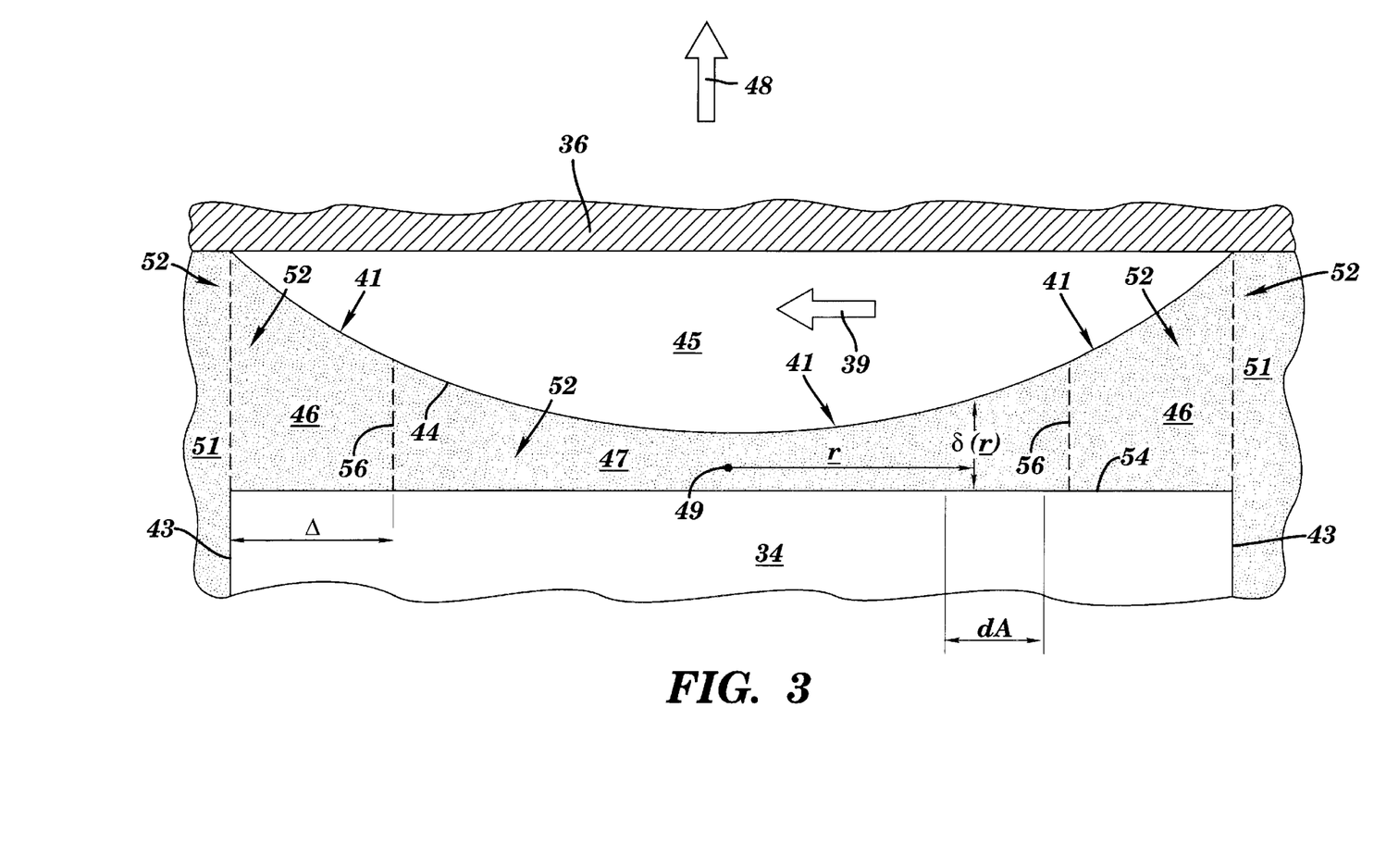
FIG. 3 depicts an enlarged view of the thermally conductive shape of FIG. 2.

After the semiconductor device 34 is coupled to the electronic carrier 32, a thermally conductive encapsulant 40 (e.g., epoxy) in an uncured or partially cured state is dispensed on the semiconductor device 34 and around the peripheral edges 43 of the semiconductor device 34. The encapsulant 40 may include, inter alia, an epoxy material, a silicone, an acrylic, or an acrylate. Then a profiled heat spreader 50, which comprises a thermally conductive shape 45 on a heat spreader 36, is pushed into the encapsulant 40, wherein the thermally conductive shape 45 pushes and redistributes the encapsulant 40 in a geometric pattern (relative to the semiconductor device 34 and the profiled heat spreader 50) such as is shown in FIG. 2. Note that the profiled heat spreader 50 may be formed, as will be described infra, before, during, or after the 130 encapsulant 40 is dispensed on the semiconductor device 34. After being moved and redistributed by the profiled heat spreader 50, the encapsulant 40 is cured (i.e. substantially cured) by any method known to one of ordinary skill in the art (e.g., by heating or by pressurization at elevated temperature) and thus transformed into a cured material 52, as shown in FIG. 3, that mechanically and thermally couples the heat spreader 36 to the semiconductor device 34. Note that if a material is referred to herein as "cured" (e.g., the cured material 52, or the cured material 152 discussed infra), then "cured" means "substantially cured."

Returning to FIG. 2, the thermally conductive shape 45 that is formed on the heat spreader 36 may alternatively be formed on a heat sink 37 that comprises the heat spreader 36 and conductive fins 42. The heat spreader 36 and the heat sink 37 are each examples of a thermally conductive member. A thermally conductive member is defined as any thermally conductive structure such as a heat spreader or heat sink. Although the discussion infra of the first embodiments of the present invention discusses only the heat spreader 36, it should be understood that the heat sink 37 may be alternatively present and is analogous to the heat spreader 16. Thus the heat sink 37, or a thermally conductive member generally, is within the scope of the first embodiments of the present invention. The thermally conductive member (e.g., heat spreader 36, heat sink 37, etc.) may comprise a material that is thermally conductive such as a metal (e.g., copper, aluminum, stainless steel), a ceramic (e.g., alumina), or a cermet (e.g., aluminum silicon carbonate).

The thermally conductive shape 45 has a bounding surface 44 whose shape and/or orientation results in a variable thickness δ as will be discussed infra. The thickness δ is the thickness of the encapsulant 40 between the bounding surface 44 and a semiconductor device 34 in a direction 48 that is normal to a surface 54 of the semiconductor device 34.

The thermally conductive shape 45 comprises any thermally conductive matter (e.g., a metal, a thermally conductive plastic, etc.). The thermally conductive shape 45 may be formed on the heat spreader 36 by any method known to one of ordinary skill in the art. For example, if the thermally conductive shape 45 includes thermally conductive plastic, then the plastic could be molded onto the heat spreader 36 in any desired shape, or may alternatively be dispensed onto the heat spreader 36 and then shaped by surface tension. As another example, if the thermally conductive shape 45 includes a metal or a solder, then the metal could be plated, or the solder could be reflowed, onto the heat spreader 36. The thermally conductive shape 45 should have a sufficiently high thermal conductivity to facilitate effective heat removal from the semiconductor device 34 during thermal cycling or during other periods in which the semiconductor device 34 is heated. In the first embodiments of the present invention, the thermal conductivity of the thermally conductive shape 45 should be at least about 0.001 watt/(mm ° K.).

A process for forming the thermally conductive shape 45 on the heat spreader 36 is called "surface profiling." As a result of the surface profiling, the profiled heat spreader 50 is formed and comprises the thermally conductive shape 45 on the heat spreader 36. Since the heat sink 37 (or a thermally conductive member generally) could substitute for the heat spreader 36, the profiled heat spreader 36 could be replaced by an analogously profiled heat sink or an analogously profiled thermally conductive member.

FIG. 3 depicts an enlarged view of the thermally conductive shape 45 of FIG. 2. FIG. 3 also shows the cured material 52 as comprising a central portion 47, a peripheral portion 46, and an outer portion 51. A layer of encapsulant 41 exists between the thermally conductive shape 45 and the semiconductor device 34, wherein the layer of cured encapsulant 41 is bounded in a direction 39 that is normal to the direction 48 between the peripheral edges 43 of the semiconductor device 34. The layer of encapsulant 41 includes both the central portion 47 and the peripheral portion 46 of the cured material 52.

As stated supra, the shape and/or orientation of the surface 44 of the thermally conductive shape 45 is such that a thickness δ(r) of the layer of encapsulant 41 is spatially variable (i.e., varies with r and is thus not constant), wherein r is a coordinate vector in the plane normal to the direction 48 as measured from a center of coordinates 49. The coordinate vector r may be expressed as r(X,Y) in terms of Cartesian coordinate components X and Y measured from the center of coordinates 49.

As an approximation, the peak thermally induced interfacial stresses between the cured material 52 and both the semiconductor device 34 and the heat spreader 36 are directly dependent on the thickness δ(r) near the peripheral edges 43 of the semiconductor device 34; i.e., in the peripheral portion 46. Thermally induced interfacial stresses are relatively small in the central portion 47 due to bending of the heat spreader 36. Thus, the thermally induced interfacial stresses resulting from thermal cycling are reduced at the peripheral portion 46. Since increasing δ(r) decreases thermally induced stresses in a vicinity at or near r, δ(r) varies such that an average value of δ(r) for the peripheral portion 46 of the layer of encapsulant 41 exceeds an average value of δ(r) for the central portion 47 of the layer of encapsulant 41. The average value ($δ_{P-AVE}$) of δ(r) for the peripheral portion 46 is calculated as $\int dA_P\, δ(r)/\int dA_P$ over the portion of the surface 54 that is within the peripheral portion 46, wherein $dA_P$ is a differential surface area element within the portion of the surface 54 that is within the peripheral portion 46. The average value (δ C-AVE) of δ(r) for the central portion 47 is calculated as $\int dA_C\, δ(r)/\int dA_C$ over the portion of the surface 54 that is within the central portion 47, wherein $dA_C$ is a differential surface area element within the portion of the surface 54 that is within the central portion 47. Thus, the relatively larger value of δ(r) in the peripheral portion 46 in comparison with δ(r) in the central portion 47, as reflected in the average values of δ(r), substantially reduces thermally induced stresses where the thermally induced stresses are most pronounced, namely in the peripheral portion 46. In the first embodiments, $\delta_{P\text{-}AVE}/\delta_{C\text{-}AVE}$ should be at least about 2, and a minimum thickness $\delta(r)$ in the peripheral region should be about 3 mils.

In addition to having $\delta(r)$ sufficiently large in the peripheral portion 46, effective stress reduction requires that the peripheral portion 46 be sufficiently defined in terms of its width $\Delta$, which is defined as the width of the peripheral portion 46 in the direction 39. In the first embodiments, the width $\Delta$ should be at least about 8 mils.

Note that $\delta(r)$ is relatively small in the central portion 47 in order to have a small thermal resistance $R_{th}$ for the layer of encapsulant 41, which facilitates effective heat transport from the semiconductor device 34 in the direction 48 during thermal cycling. $R_{th}$ may be calculated as $[\int dA\, K(r)/\delta(r)]^{-1}$ wherein $K(r)$ is a thermal conductivity of the layer of encapsulant 41, $dA$ is a differential surface area element of a surface 54 of the semiconductor device 34, and the integration is over the surface 54. Accordingly, $R_{th}$ may be controlled for heat transfer purposes by including a conductive material with a high $K(r)$, and keeping $\delta(r)$ sufficiently small in light of $K(r)$ and the heat transfer surface area $\int dA$.

While FIGS. 2 and 3 show the surface 44 of the thermally conductive shape 45 to have a dome shape, there are many acceptable shapes and/or orientations for the surface 44 such that $\delta(r)$ varies with $r$ so that $\delta(r)$ is not constant. For example, $\delta(r)$ may be constant in the central portion 47 or in the peripheral portion 46. As another example, $\delta(r)$ may be constant in both the central portion 47 and the peripheral portion 46, but may not have a same constant value in the both the central portion 47 and the peripheral portion 46.

A variant of FIGS. 2–3 that is within a scope of the present invention includes replacing the encapsulant 40 in FIG. 2 by an adhesive (e.g., an epoxy adhesive) that attaches the 20 semiconductor device 34 to the heat spreader 36 (or heat sink 37 or thermally conductive member, as explained supra). With the adhesive variant, some or all of the of the outer portion 51 of the cured material 52 in FIG. 3 may be absent, because the adhesive in the outer portion 51 may not be needed to attach the semiconductor device 34 to the heat spreader 36. In accordance with the adhesive variant, the encapsulant 40 in FIG. 2 may be generalized to represent a material 40 such as the encapsulant shown in FIG. 2 or the adhesive described supra. Similarly, the cured material 52 in FIG. 3 may be generalized to represent the material 40 (i.e., the encapsulant or the adhesive) after the material 40 has been cured.

Figure 4:
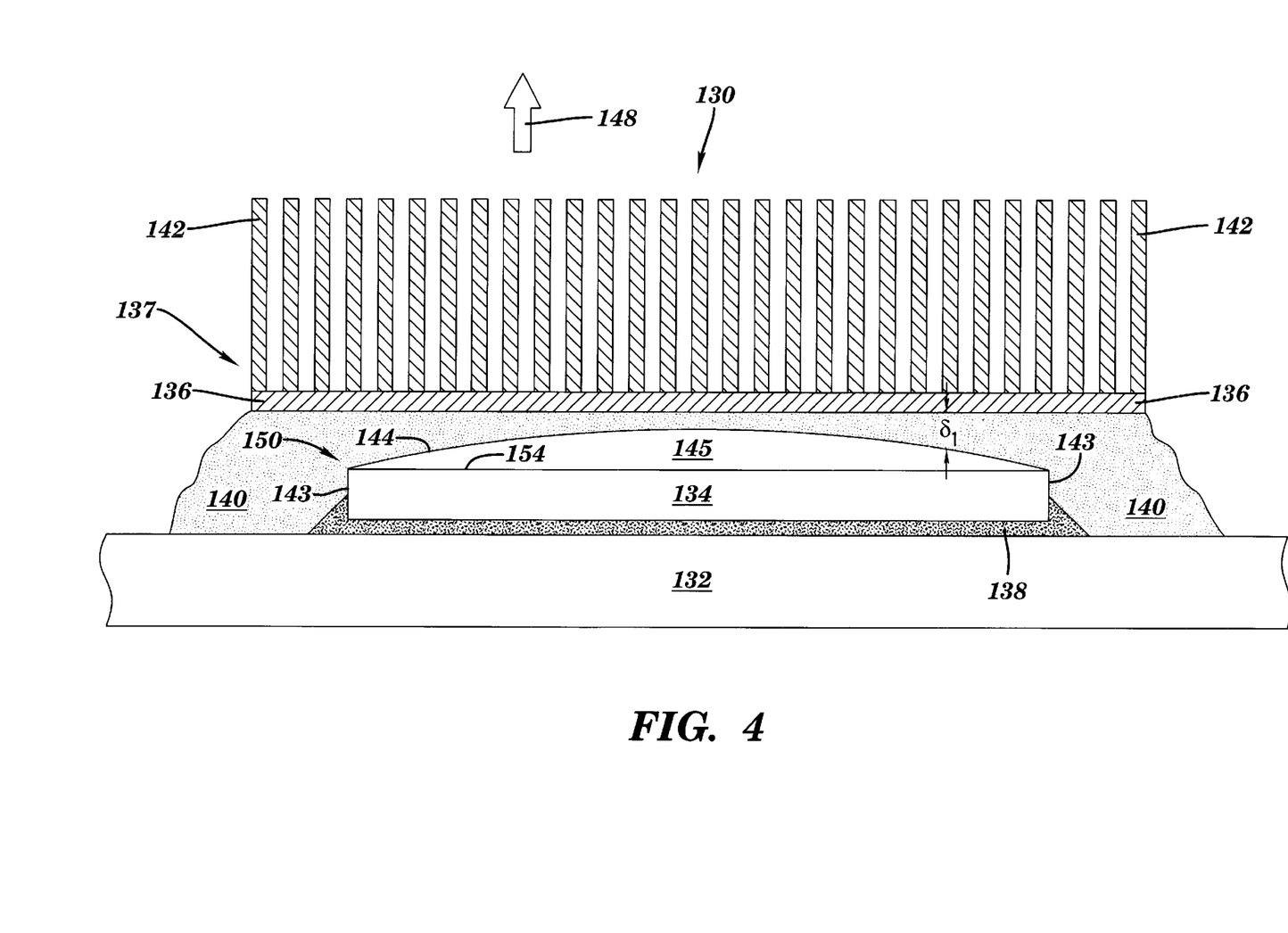
FIG. 4 depicts a front cross-sectional view of an electronic package having a thermally conductive shape, in accordance with second embodiments of the present invention.

FIG. 4 illustrates a front cross-sectional view of an electronic package 130, in accordance with second embodiments of the present invention. The electronic package 130 is fabricated as follows. A semiconductor device 134 is coupled to an electronic carrier 132 by any method known to one of ordinary skill in the art. The semiconductor device 134, may include, inter alia, a semiconductor chip. The electronic carrier 132 may include, inter alia, a chip carrier or a circuit card. An example of coupling the semiconductor device 134 to the electronic carrier 132, wherein the semiconductor device 134 includes a semiconductor chip and the electronic carrier 132 includes a chip carrier, is by a controlled collapse chip connection (C4) process using C4 solder balls (not shown). An underfill 138 may be inserted between the semiconductor device 134 and the electronic carrier 132 to mitigate thermally induced stresses resulting from a coefficient of thermal expansion (CTE) mismatch between the semiconductor device 134 and the electronic carrier 132.

Figure 5:
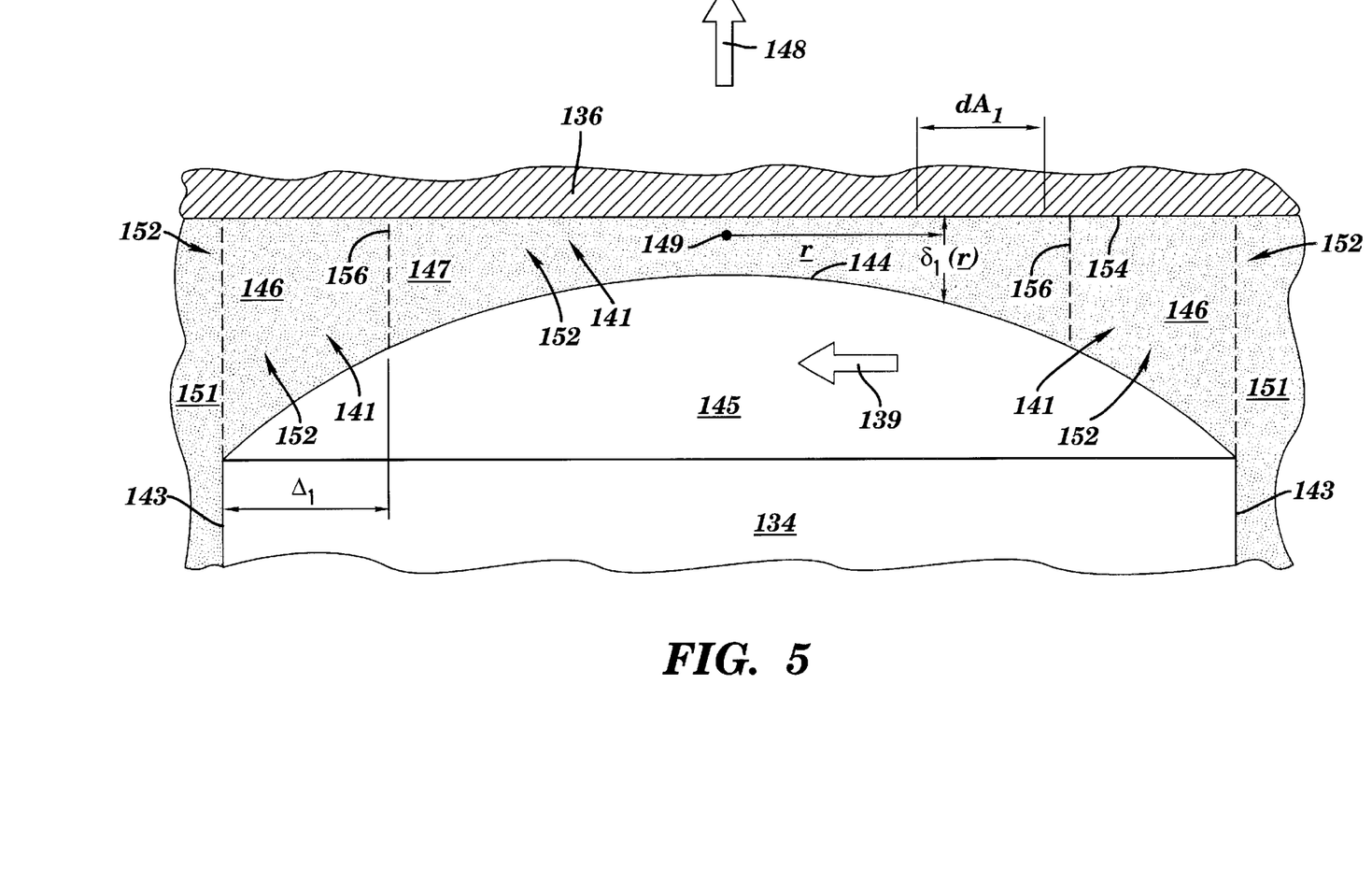
FIG. 5 depicts an enlarged view of the thermally conductive shape of FIG. 4.

After the semiconductor device 134 is coupled to the electronic carrier 132, a thermally conductive shape 145 is formed on the semiconductor device 134 to form a profiled semiconductor device 150; i.e., the profiled semiconductor device 150 comprises the thermally conductive shape 145 on the semiconductor device 134. A process for forming the thermally conductive shape 145 on the semiconductor device 134 is called "surface profiling." Next, an encapsulant 140 (e.g., epoxy) in an uncured or partially cured state is dispensed on the thermally conductive shape 145 of the profiled semiconductor device 150 and further dispensed around the peripheral edges 143 of the semiconductor device 134. The encapsulant 140 may include, inter alia, an epoxy material, a silicone, an acrylic, or an acrylate. Then a heat spreader 136, is pushed into the encapsulant 140, wherein the heat spreader 136 pushes and redistributes the encapsulant 140 in a geometric pattern (relative to the profiled semiconductor device 150 and the heat spreader 136) such as is shown in FIG. 4. After being moved and redistributed by the heat spreader 136, the encapsulant 140 is cured (i.e. substantially cured) by any method known to one of ordinary skill in the art (e.g., by heating or by pressurization at elevated temperature) and thus transformed into a cured material 152, as shown in FIG. 5, that mechanically and thermally couples the heat spreader 136 to the semiconductor device 150.

Returning to FIG. 4, the heat spreader 136 may be replaced by a heat sink 137 that comprises the heat spreader 136 and conductive fins 142. The heat spreader 136 and the heat sink 137 are each examples of a thermally conductive member. As stated supra, a thermally conductive member is defined as any thermally conductive structure such as a heat spreader or heat sink. Although the discussion infra of the second embodiments of the present invention discusses only the heat spreader 136, it should be understood that the heat sink 137 may be alternatively present and is analogous to the heat spreader 136. Thus the heat sink 137, or a thermally conductive member generally, is within the scope of the second embodiments of the present invention. The thermally conductive member (e.g., heat spreader 136, heat sink 137, etc.) may comprise a material that is thermally conductive such as a metal (e.g., copper, aluminum, stainless steel), a ceramic (e.g., alumina), or a cermet (e.g., aluminum silicon carbonate).

The thermally conductive shape 145 has a bounding surface 144 whose shape and/or orientation results in a variable thickness 61 as will be discussed infra. The thickness 81 is the thickness of the encapsulant 140 between the bounding surface 144 and heat spreader 136 in a direction 148 that is normal to a surface 154 of the semiconductor device 134.

The thermally conductive shape 145 comprises any thermally conductive matter (e.g., a metal, a thermally conductive plastic, etc.). The thermally conductive shape 145 may be formed on the semiconductor device 134 by any method known to one of ordinary skill in the art. For example, if the thermally conductive shape 145 includes thermally conductive plastic, then the plastic could be molded onto the semiconductor device 134 in any desired shape, or may alternatively be dispensed onto the semiconductor device 134 and then shaped by surface tension. As another example, if the thermally conductive shape 145 includes a metal or a solder, then the metal could be plated, or the solder could be reflowed, onto the semiconductor device 134. The thermally conductive shape 145 should have a sufficiently high thermal conductivity to facilitate effective heat removal from the semiconductor device 134 during thermal cycling or during other periods in which the semiconductor device 134 is heated. In the second embodiments of the present invention, the thermal conductivity of the thermally conductive shape 145 should be at least about 0.001 watts/(mm ° K.).

FIG. 5 depicts an enlarged view of the thermally conductive shape 145 of FIG. 4. FIG. 5 also shows the cured material 152 as comprising a central portion 147, a peripheral portion 146, and an outer portion 151. A layer of encapsulant 141 exists between the thermally conductive shape 145 and the heat spreader 136, wherein the layer of encapsulant 141 is bounded in a direction 139 that is normal to the direction 148 between the peripheral edges 143 of the semiconductor device 134. The layer of encapsulant 141 includes both the central portion 147 and the peripheral portion 146 of the cured material 152.

The shape and/or orientation of the surface 144 of the thermally conductive shape 145 is such that a thickness $\delta_1(r)$ of the layer of encapsulant 141 is spatially variable (i.e., varies with r and is thus not constant), wherein r is a coordinate vector in the plane normal to the direction 148 as measured from a center of coordinates 149. The coordinate vector r may be expressed as r(X,Y) in terms of Cartesian coordinate components X and Y measured from the center of coordinates 149.

As an approximation, the peak thermally induced interfacial stresses between the cured material 152 and both the semiconductor device 134 and the heat spreader 136 are directly dependent on the thickness $\delta_1(r)$ near the peripheral edges 143 of the semiconductor device 134; i.e., in the peripheral portion 146. The thermally induced interfacial stresses are relatively small in the central portion 147 due to bending of the heat spreader 136. Thus, the thermally induced interfacial stresses resulting from thermal cycling are reduced at the peripheral portion 146. Since increasing $\delta_1(r)$ decreases thermally induced stresses in a vicinity at or near r, $\delta_1(r)$ varies such that an average value of $\delta_1(r)$ for the peripheral portion 146 of the cured material 152 exceeds an average value of $\delta_1(r)$ for the central portion 147 of the cured material 152. The average value ($\delta_{P1-AVE}$) of $\delta_1(r)$ for the peripheral portion 146 is calculated as $\int dA_{P1} \delta_1(r)/\int dA_{P1}$ over the portion of the surface 154 that is within the peripheral portion 146, wherein $dA_{P1}$ is a differential surface area element within the portion of the surface 154 that is within of the peripheral portion 146. The average value ($\delta_{C1-AVE}$) of $\delta_1(r)$ for the central portion 147 is calculated as $\int dA_{C1} \delta_1(r)/\int dA_{C1}$ over the portion of the surface 154 that is within central portion 147, wherein $dA_{C1}$ is a differential surface area element within the portion of the surface 154 that is within the central portion 147. Thus, the relatively larger value of $\delta_1(r)$ in the peripheral portion 146 in comparison with $\delta_1(r)$ in the central portion 147, as reflected in the average values of $\delta_1(r)$, substantially reduces thermally induced stresses where the thermally induced stresses are most pronounced, namely in the peripheral portion 146. In the second embodiments, $\delta_{P1-AVE}/\delta_{C1-AVE}$ should be at least about 2, and a minimum thickness $\delta_1(r)$ in the peripheral region should be about 3 mils.

In addition to having $\delta_1(r)$ sufficiently large in the peripheral portion 146, effective stress reduction requires that the peripheral portion 146 be sufficiently defined in terms of its width $\Delta_1$, which is defined as the width of the peripheral portion 146 in the direction 139. In the second embodiments, the width $\Delta_1$ should be at least about 8 mils.

Note that $\delta_1(r)$ is relatively small in the central portion 147, as compared with the peripheral portion 146, in order to have a small thermal resistance $R_{th1}$ for the layer of encapsulant 141, which facilitates effective heat transport from the semiconductor device 134 in the direction 148 during thermal cycling. $R_{th1}$ may be calculated as $[\int dA_1 K_1(r)/\delta_1(r)]_{-1}$ wherein $K_1(r)$ is a thermal conductivity of the layer of encapsulant 141, $dA_1$ is a differential surface area element of a surface 154 of the heat spreader 136, and the integration is over the surface 154. Accordingly, $R_{th1}$ may be controlled for heat transfer purposes by including a conductive material with a high $K_1(r)$, and keeping $\delta_1(r)$ sufficiently small in light of $K_1(r)$ and the heat transfer surface area $\int dA_1$.

While FIGS. 4 and 5 show the surface 144 of the thermally conductive shape 145 to have a dome shape, there are many acceptable shapes and/or orientations for the surface 144 such that $\delta_1(r)$ varies with r so that $\delta_1(r)$ is not constant. For example, $\delta_1(r)$ may be constant in the central portion 147 or in the peripheral portion 146. As another example, $\delta_1(r)$ may be constant in both the central portion 147 and the peripheral portion 146, but may not have a same constant value in the both the central portion 147 and the peripheral portion 146.

A variant of FIGS. 4–5 that is within a scope of the present invention includes replacing the encapsulant 140 in FIG. 4 by an adhesive (e.g., an epoxy adhesive) that attaches the profiled semiconductor device 150 to the heat spreader 136 (or heat sink 137 or thermally conductive member, as explained supra). With the adhesive variant, some or all of the of the outer portion 151 of the cured material 152 in FIG. 5 may be absent, because the adhesive in the outer portion 151 may not be needed to attach the profiled semiconductor device 150 to the heat spreader 136. In accordance with the adhesive variant, the encapsulant 140 in FIG. 4 may be generalized to represent a material such as the encapsulant shown in FIG. 4 or the adhesive described supra. Similarly, the cured material 152 in FIG. 5 may be generalized to represent the material 140 (i.e., the encapsulant or the adhesive) after the material 140 has been cured.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. An electronic package, comprising:
   a first structure selected from the group consisting of a semiconductor device and a thermally conductive member;
   a second structure, wherein the second structure includes the thermally conductive of member if the first structure includes the semiconductor device, and wherein the second structure includes the semiconductor device if the first structure includes the thermally conductive member;
   a thermally conductive shape in contact with the first structure; and
   a thermally conductive material in contact with the second structure and with the thermally conductive shape, wherein an average thickness of a peripheral portion of the thermally conductive material exceeds an average thickness of a central portion of the thermally conductive material.

2. The electronic package of claim 1, wherein the average thickness of the peripheral portion of the thermally conductive material exceeds the average thickness of the central portion of the thermally conductive material by a factor of at least 2.

3. The electronic package of claim 1, wherein a minimum thickness of the peripheral portion of the thermally conductive material is about 3 mils.

4. The electronic package of claim 1, wherein a minimum width of the peripheral portion of the thermally conductive material is about 8 mils.

5. The electronic package of claim 1, wherein a thickness of the central portion of the thermally conductive material is about constant.

6. The electronic package of claim 1, wherein a thickness of the peripheral portion of the thermally conductive material is about constant.

7. The electronic package of claim 1, wherein the thermally conductive shape includes a material having a thermal conductivity of at least about 0.001 watt/(mm $°$ K.).

8. The electronic package of claim 1, wherein the thermally conductive shape includes a material selected from the group consisting of a metal, a solder, and a plastic.

9. The electronic package of claim 1, wherein the thermally conductive member is selected from the group consisting of a heat spreader and a heat sink.

10. The electronic package of claim 1, wherein the thermally conductive member includes a material that is thermally conductive, and wherein the material that is thermally conductive is selected from the group consisting of a metal, a ceramic, and a cermet.

11. The electronic package of claim 1, wherein the thermally conductive material is selected from the group consisting of an encapsulant and an adhesive.

12. The electronic package of claim 1, wherein the thermally conductive material includes an epoxy material.

13. The electronic package of claim 1, wherein the semiconductor device includes a semiconductor chip.

14. The electronic package of claim 13, wherein the semiconductor device is coupled to an electronic carrier selected from the group consisting of a semiconductor chip carrier and a circuit card.

15. A method of forming an electronic package, comprising:

forming a thermally conductive shape on a first structure, wherein the first structure is selected from the group consisting of a semiconductor device and a thermally conductive member;

interfacing a material in an uncured or partially cured state between a second structure and the thermally conductive shape, wherein the material is thermally conductive, wherein the second structure includes the thermally conductive member if the first structure includes the semiconductor device, and wherein the second structure includes the semiconductor device if the first structure includes the thermally conductive member; and curing the material, wherein an average thickness of a peripheral portion of the cured material exceeds an average thickness of a central portion of the cured material.

16. The method of claim 15, wherein the first structure is the semiconductor device, wherein the second structure is the thermally conductive member, and wherein the interfacing step includes:

dispensing the material on the thermally conductive shape; and pressing the thermally conductive member on the material, wherein the material is redistributed to contact both the thermally conductive shape and the thermally conductive member.

17. The method of claim 15, wherein the first structure is the thermally conductive member, wherein the second structure is the semiconductor device, and wherein the interfacing step includes:

dispensing the material on the semiconductor device; and applying the thermally conductive member to the material such that the thermally conductive shape pushes into the material, wherein the material is redistributed to contact both the thermally conductive shape and the semiconductor device.

18. The method of claim 15, wherein the average thickness of the peripheral portion of the thermally conductive material exceeds the average thickness of the central portion of the thermally conductive material by a factor of at least 2.

19. The method of claim 15, wherein a minimum thickness of the peripheral portion of the thermally conductive material is about 3 mils.

20. The method of claim 15, wherein a minimum width of the peripheral portion of the thermally conductive material is about 8 mils.

21. The method of claim 15, wherein a thickness of the central portion of the thermally conductive material is about constant.

22. The method of claim 15, wherein a thickness of the peripheral portion of the thermally conductive material is about constant.

23. The method of claim 15, wherein the thermally conductive shape includes a material having a thermal conductivity of at least about 0.001 watt/(mm $°$ K.).

24. The method of claim 15, wherein the thermally conductive shape includes a material selected from the group consisting of a metal, a solder, and a plastic.

25. The method of claim 15, wherein the forming step includes selecting from the group consisting of molding a plastic material onto a surface of the first structure and dispensing the plastic material onto the surface of the first structure.

26. The method of claim 15, wherein the forming step includes reflowing a solder material onto a surface of the first structure.

27. The method of claim 15 wherein the thermally conductive member is selected from the group consisting of a heat spreader and a heat sink.

28. The method of claim 15, wherein the thermally conductive member includes a material that is thermally conductive, and wherein the material that is thermally conductive is selected from the group consisting of a metal, a ceramic, and a cermet.

29. The method of claim 15, wherein the thermally conductive material is selected from the group consisting of an encapsulant and an adhesive.

30. The method of claim 15, wherein the thermally conductive material includes an epoxy material.

31. The method of claim 15, wherein the semiconductor device includes a semiconductor chip.

32. The method of claim 31, further comprising coupling the semiconductor device to an electronic carrier selected from the group consisting of a semiconductor chip carrier and a circuit card.

* * * * *

UNITED STATES PATENT AND TRADEMARK OFFICE
CERTIFICATE OF CORRECTION

PATENT NO. : 6,333,551 B1 Page 1 of 1
APPLICATION NO. : 09/656941
DATED : December 25, 2001
INVENTOR(S) : David V. Caletka and Eric A. Johnson It is certified that error appears in the above-identified patent and that said Letters Patent is hereby corrected as shown below:

Column 1, line 39, delete "5"
Column 3, line 59, after "plastic", insert --a ceramic, a cermet such as aluminum silicon carbonate,--
Column 5, line 33, delete "20"
Column 6, line 45, delete "61" and insert --$\delta_1$--
Column 6, line 52, after "plastic", insert --a ceramic, a cermet such as aluminum silicon carbonate,--
Column 7, line 28, after "146", insert --due to bending of the heat spreader 136--

Signed and Sealed this

Fifteenth Day of July, 2008

JON W. DUDAS
*Director of the United States Patent and Trademark Office*